(12) United States Patent
Uchida

(10) Patent No.: US 7,875,909 B2
(45) Date of Patent: Jan. 25, 2011

(54) GATE ARRAY

(75) Inventor: Hirofumi Uchida, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 1097 days.

(21) Appl. No.: 11/600,829

(22) Filed: Nov. 17, 2006

(65) Prior Publication Data
US 2007/0138510 A1    Jun. 21, 2007

(30) Foreign Application Priority Data
Dec. 21, 2005    (JP) .............................. 2005-368388

(51) Int. Cl.
*H01L 27/10* (2006.01)
(52) U.S. Cl. ................ 257/206; 257/204; 257/207; 257/208; 257/211
(58) Field of Classification Search .......... 257/202–211
See application file for complete search history.

(56) References Cited
U.S. PATENT DOCUMENTS
5,591,995 A * 1/1997 Shaw ......................... 257/206
5,760,428 A * 6/1998 Colwell et al. .............. 257/206
5,994,726 A   11/1999 Ikeda et al.

FOREIGN PATENT DOCUMENTS
JP    10335613    12/1998

* cited by examiner

*Primary Examiner*—Eugene Lee
*Assistant Examiner*—Tucker Wright
(74) *Attorney, Agent, or Firm*—Volentine & Whitt, P.L.L.C.

(57) ABSTRACT

A gate array of a semiconductor substrate on which plural unit cells are arranged in parallel, the unit cells having the same pattern that includes a source potential region VDD, a PMOS, an NMOS and a ground potential region GND. Metal wiring lines being formed, with an insulating layer between, on the unit cells, with contacts that make electrical connection between the metal wiring lines and the unit cell transistors. The gate wiring of a transistor in a non-used unit cell is used in place of a metal wiring line. By doing so, the area of metal wiring lines in a gate array is reduced and the array wiring efficiency is increased.

2 Claims, 4 Drawing Sheets

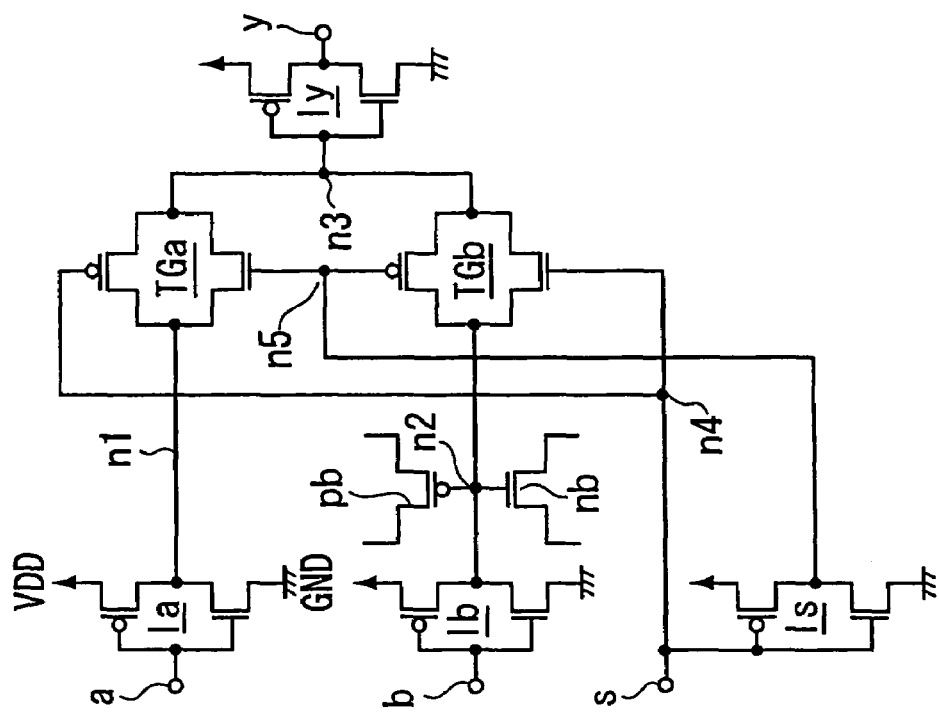
F I G. 1B
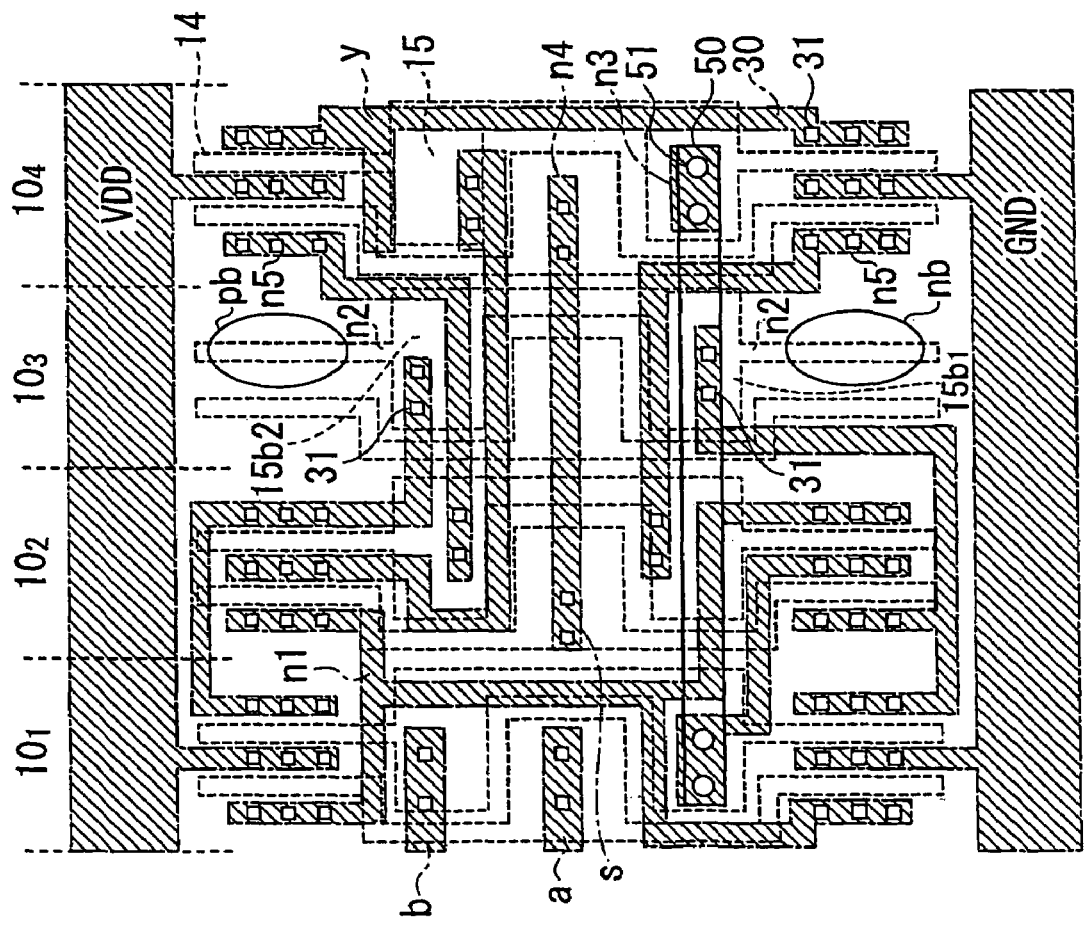
F I G. 1A

GATE ARRAY

CROSS-REFERENCE TO RELATED APPLICATION

This application claims priority under 35 USC 119 from Japanese Patent Application No. 2005-368388, the disclosure of which is incorporated by reference herein.

BACKGROUND OF THE INVENTION

1. Field of the Invention

The invention relates to a gate array consisting of unit cells on a semiconductor substrate, and in particular to wiring between unit cells.

2. Description of the Related Art

In general in gate arrays, unit cells with P channel MOS transistors (referred to as "PMOS" below) and N channel MOS transistors (referred to as "NMOS" below), and gate wiring for the PMOS and NMOS, are placed in specific positions on a semiconductor substrate. By carrying out wiring between the unit cells, desired logic circuits can be configured.

FIGS. 2A to 2C are block diagrams for explanation of one example of a gate array using unit cells, wherein FIG. 2A is a plan view, FIG. 2B is a cross sectional view taken on line X-X in FIG. 2A, and FIG. 2C is a cross sectional view taken on line Y-Y in FIG. 2A.

This unit cell 10 is formed on a p-type semiconductor substrate 1, and two PMOSs 12a, 12b are formed aligned in an n-well 11 at the top side of the plan view. At the lower side of the plan view there are two NMOSs 13a, 13b formed aligned on the p-type semiconductor substrate 1. The gates of PMOS 12a and NMOS 13a are connected with gate wiring 14a of polysilicon, and a gate terminal portion 15a with a comparatively wide area is formed in the middle of gate wiring 14a. In the same way, the gates of PMOS12b and NMOS13b are connected with gate wiring 14b of polysilicon, and two gate terminal portions 15b1 and 15b2 with a comparatively wide area are formed between the ends of gate wiring 14b. Further, outside of PMOS12a, 12b (the top side of FIG. 2A) there is an n+ region 16 formed for use as a source potential region, and on the outside of NMOS13a, 13b (the bottom side of FIG. 2B) there is a p+ region 17 formed for use as a ground potential region GND. A gate array base is constructed with unit cells 10 like this arranged with the same orientation vertically and laterally across a semiconductor substrate 1.

The surface of the gate array base is covered with a first insulating layer 20, and on the surface of this first insulating layer 20 is formed a first metal wiring layer 30, and the gate array base and the first metal wiring layer 30 are placed in electrical contact through contactors 31. It is not shown in the Figures, but there is a second insulating layer on the surface of the first metal wiring layer 30, and on the surface of this second insulating layer is formed a second metal wiring layer 50, and the first metal wiring layer and the second metal wiring layer are electrically connected via through holes. Further, depending on the scale of the circuit, a third metal wiring layer and a fourth metal wiring layer and the like can be used.

FIGS. 3A, 3B are block diagrams for explanation of one example of a conventional gate array using unit cells of FIG. 2, wherein FIG. 3A is a plan view, and FIG. 3B is the equivalent circuit diagram.

In FIGS. 3A, 3B regions surrounded by dotted lines indicate gate wiring 14 and gate terminal portions 15; regions shown as diagonal lines inside and surrounded by single dot chain lines indicate first metal wiring layer 30; and regions surrounded by bold lines indicate second metal wiring layer 50; looking from above the substrate gate wiring 14 and gate terminal portions 15 are visible through the second metal wiring layer 50 and the first metal wiring layer 30. Further, the small rectangular boxes in the diagram are the contacts 31, connecting the first metal wiring layer 30 and the substrate, and the small circles in the diagram are the through holes 51, connecting the second metal wiring layer 50 and the substrate. In the diagram only representative examples of the above items are annotated with reference labels.

This gate array, as shown in FIG. 3B, is a two input selector circuit, in which input signals applied to input terminal a, b, are selected, according to a selection signal applied to a control terminal s, and output from output terminal y.

As is seen in FIG. 3A, this is an array of 4 units of the unit cells 10 of FIG. 2A arranged in parallel. The unit cell $10_1$ on the left edge of the figure uses inverters la, Ib, to invert input signals applied to input terminals a and b, an dthe second unit cell $10_2$ uses the output signal from the inverters la, lb as ON/OFF for transfer gates TGa, TGb. In the fourth unit cell $10_4$ the inverter Is is used to invert the selection signal applied to control terminal s, and the inverter ly is used to invert the signal output from transfer gate TGa or TGb in the ON condition and output to output terminal y.

The third unit cell $10_3$ uses the first metal wiring layer 30 as the vertical direction wiring region, and the transistor gate wiring 14a, 14b in this unit cell $10_3$ is not used. Further, in this gate array, in order to undertake wiring for the lateral direction of nodes N1, N2 and N3, the second metal wiring layer 50 is used.

In the publication of Japanese Patent Application Laid-Open (JP-A) No. H10-335613 is disclosed a semiconductor integrated circuit in which the source/drain regions of a transistor are given reduced resistance by being salicided, and these areas then used in place of first aluminum wiring in the wiring within the cell.

However, the above gate array uses the first metal wiring layer 30 at the top side of the third, unused, unit cell $10_3$ as a vertical wiring region. Because of this three lines of lateral wiring are in the second metal wiring layer 50, and the wiring efficiency is decreased, and, depending on the scale of the circuit, a further third or fourth metal wiring layer becomes necessary, making the manufacturing process more complicated.

That is, in an actual gate array, a circuit block, configured from a basic logical circuit of a number of unit cells 10 as in the example of a selector in FIGS. 3A, 3B, is referred to as a "cell" and plural cells are configured on a semiconductor substrate in the vertical and lateral directions. The wiring between the unit cells 10 within a cell is done individually by a designer manually, and recorded within the library of an automatic wiring tool. The wiring between cells in a gate array of a combination of plural cells is undertaken using an automatic wiring tool. The wiring paths between cells are determined according to the cell configurations recorded in the automatic wiring tool library. When undertaking the wiring between cells, when trying to directly connect wiring between cells if the second metal wiring layer 50 is already used within a cell, this portion cannot be arranged in the wiring between cells, giving the need for a further number of metal wiring layers, third and fourth etc, in some cases.

SUMMARY OF THE INVENTION

The object of the invention is to reduce the second metal wiring within a cell in a gate cell array, and increase the wiring efficiency.

According to an aspect of the present invention, there is provided a gate array including: a plurality of unit cells, the unit cells arranged in parallel on a semiconductor substrate and having the same pattern including a first MOS transistor and a second MOS transistor, the first MOS transistor and the second MOS transistor each including a gate, a source and a drain, the gate of the first MOS transistor and the gate of the second MOS transistor being connected by gate wiring, with the gate wiring having a first gate terminal portion and a second gate terminal portion; a plurality of metal wiring lines, formed, with an insulating layer between, on the unit cells; a plurality of contacts, that make electrical connection between the metal wiring lines and the first gate terminal portion, the second gate terminal portion, the source or the drain; wherein there is one of the plurality of contacts at each of the first gate terminal portion and at the second gate terminal portion in one of the unit cells in which neither the first MOS transistor nor the second MOS transistor is being used as a transistor.

In the invention, because contacts are provided on the gate terminal portions of transistors that are not used in the unit cells, connecting to the metal wiring, the gate wiring of these unused unit cells can be used in place of metal wiring. By doing so, the area of metal wiring can be reduced, generating some latitude, resulting in being able to improve the wiring efficiency.

BRIEF DESCRIPTION OF THE DRAWINGS

Preferred exemplary embodiments of the present invention will be described in detail based on the following figures, wherein:

FIG. 1A is a block diagram showing a gate array of a first embodiment of the invention;

FIG. 1B is a circuit diagram showing a gate array of a first embodiment of the invention;

DETAILED DESCRIPTION OF THE INVENTION

Figure 2A:
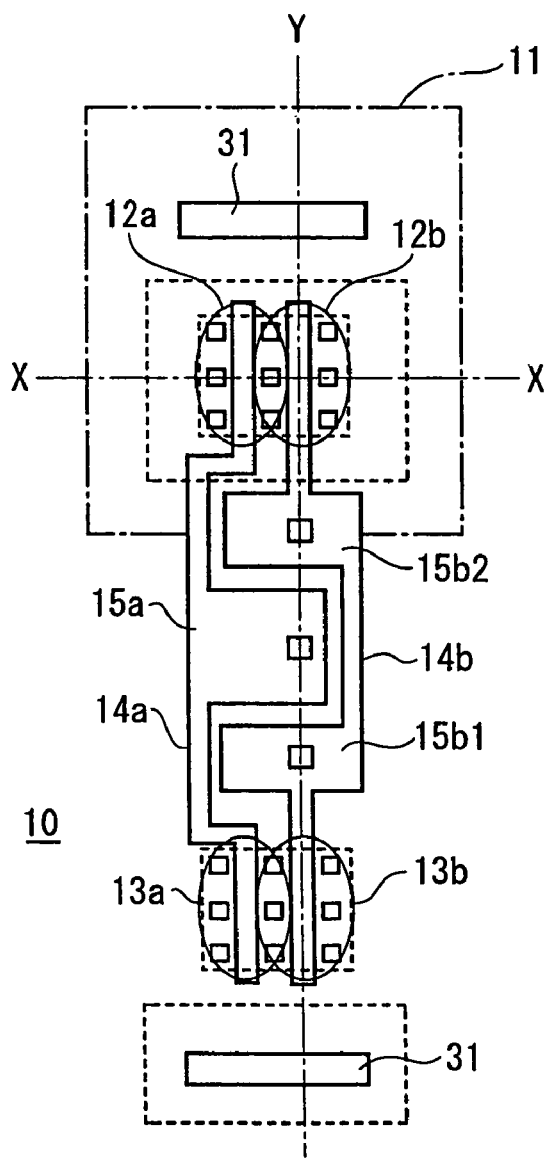
FIG. 2A is a block diagram showing an example of a unit cell using a gate array.

The above aspect of the invention together with others and the novel features, will become fully clear from reading the following preferred embodiments in the light of the accompanying drawings. However, the drawings are solely for the purposes of explanation, and the invention is not restricted thereby.

First Embodiment

FIGS. 1A and 1B show the structure of a gate array according to a first embodiment of the invention, FIG. 1A is a plan view, and FIG. 1B is the equivalent circuit diagram.

In FIG. 1A: regions surrounded by dotted lines indicate gate wiring 14 and gate terminal portions 15; regions shown as diagonal lines inside and surrounded by single dot chain lines indicate first metal wiring layer 30; and regions surrounded by bold lines indicate second metal wiring layer 50; the substrate gate wiring 14 and gate terminal portions 15 are shown from the top side, visible through the second metal wiring layer 50 and the first metal wiring layer 30. Further, the small rectangular boxes in the diagram are the contacts 31, connecting the first metal wiring layer 30 and the substrate, and the small circles in the diagram are the through holes 51, connecting the second metal wiring layer 50 and the substrate. In the diagram only representative examples of the above items are annotated with reference labels.

In this gate array, as shown in FIG. 1B, in the 2 input selector circuits, selection is made, according to a selection signal applied to the control terminal s, of input signals applied to terminal a and terminal b, and output thereof is made to output terminal y.

That is to say, the configuration is such that the input signal applied to input terminal a is inverted by inverter Ia and output to node n1, and the input signal applied to input terminal b is inverted by inverter Ib and output to node n2.

Node n1 is connected to one side of transfer gate TGa. Further, node n2 is connected to the gate of PMOSpb and NMOSnb, and also to one side of transfer gate TGb. The source and drain of PMOSpb and NMOSnb are not connected. The other sides of transfer gates TGa, TGb are connected to node n3, and node n3 is connected to the input side of inverter Iy. The output side of inverter Iy is connected to the output terminal y.

Further, it is configured such that the selection signal applied to control terminal s is applied as a control signal via node n4 to transfer gates TGa and TGb, as well as being also inverted by inverter Is, output to node n5, and applied as a complementary control signal to transfer gates TGa and TGb.

In this gate array, as shown in FIG. 1A, on the semiconductor substrate 1, there are 4 units of unit cell 10 of FIG. 2A arranged in parallel. On the left side unit cell $10_1$ the input signal from input terminals a, b, inverted by inverters Ia, Ib, are used. In the second unit cell $10_2$ the output signals from inverters Ia, Ib, are used as ON/OFF for the transfer gates TGa and TGb. In the fourth unit cell $10_4$ the inverter Is is used to invert the selection signal applied to control terminal s, and the inverter Iy is used to invert the signal output from the transfer gate TGa or TGb in the ON condition and output to output terminal y.

In the third unit $10_3$ PMOS12b and NMOS13b formed as the substrate are not used as circuit elements, and the source and drains of PMOS12b and NMOS13b are not connected to other units. However, the gate wiring 14b of polysilicon connecting PMOS12b (PMOSpb equivalent in the circuit) and NMOS13b (NMOSnb equivalent in the circuit) is used as the node 2. That is, the 2 gate terminal portions 15b1, 15b2 belonging to gate wiring 14b are connected to the first metal wiring layer 30 through contacts 31.

Also, the top side of the third unit $10_3$ is used as a vertical direction wiring area of the first metal wiring layer 30 through an insulating layer 20. The gate wiring 14a of unit cell $10_3$ is not used.

Also, for the wiring of the node n3 is in the lateral direction in this gate array, a second metal wiring layer 50 is used.

Figure 3B:
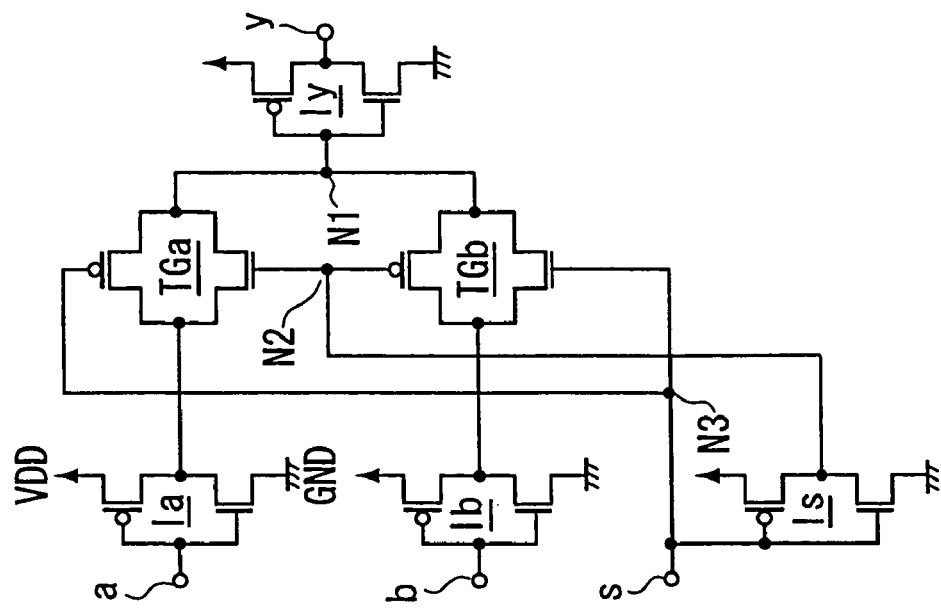
FIG. 3B is a circuit diagram showing an example of a conventional gate array.
Figure 3A:
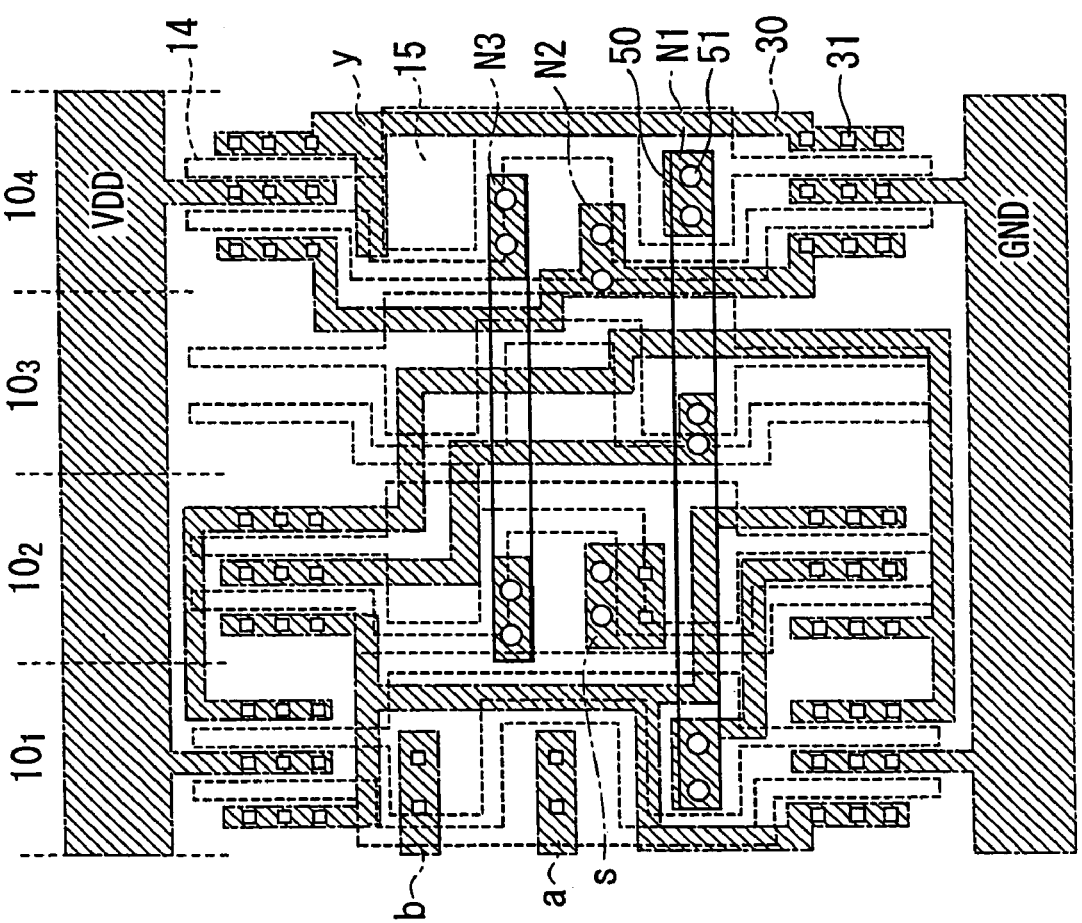
FIG. 3A is a block diagram showing an example of a conventional gate array.

In this gate array, by connecting the gate terminal portions 15b1, 15b2 belonging to gate wiring 14b of the unused circuit elements of the PMOSpb and NMOSnb 2 to first metal wiring layer 30 through contacts 31, they can be used as the vertical direction wiring for node n2. By doing this it becomes possible to provide the lateral direction wiring of nodes n4, n5 on the first metal wiring layer 30. It follows that of the 3 lines of second metal wiring layer 50 shown in FIG. 3A is reduced to one line in FIG. 1a.

A real array is configured, as shown in FIG. 1A, as plural cells, cells consisting of a basic logic circuit block of a number of unit cells 10, arranged in the vertical and lateral directions on a semiconductor substrate. The wiring between cells is carried out using an automatic wiring layout tool. According to the cell configurations recorded in a library, the automatic wiring layout tool determines the wiring paths using the metal wiring layer between cells. By reducing the metal wiring area of the cell wiring that is by the second metal wiring layer, when the wiring between the cells is carried out using the automatic wiring layout tool some leeway is generated, the efficiency of wiring layout is increased and sometimes the number of metal wiring layers can be decreased.

This gate array uses the wiring in the vertical direction of the node n2 as gate wiring, and so suspended gates of PMOSpb and NMOSnb are connected for node n2, but the increase in wiring amount caused by this is a level which can be ignored. That it does not cause a problem in practice has been confirmed by simulation.

As described above, in this first embodiment of a gate array, the gate wiring of the non-used transistors (PMOSpb and NMOSnb) are used as circuit wiring, and so it is possible to shift a portion of second metal wiring layer 50 into first metal wiring layer 30, with the benefit of raising the wiring efficiency.

Second Embodiment

Figure 4B:
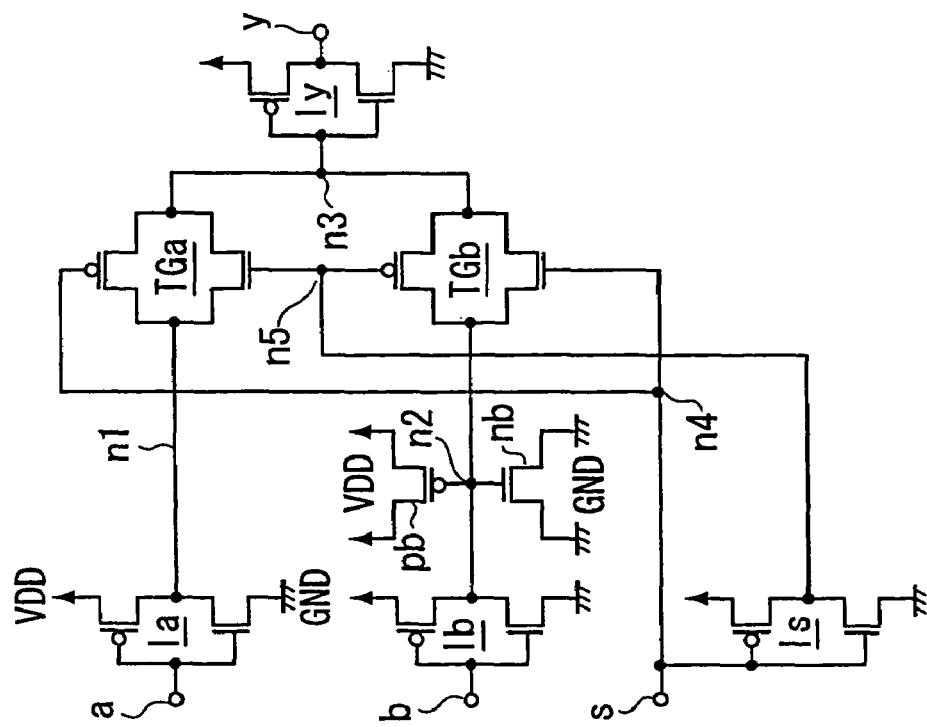
FIG. 4B is a circuit diagram showing a gate array of a second embodiment of the invention.
Figure 4A:
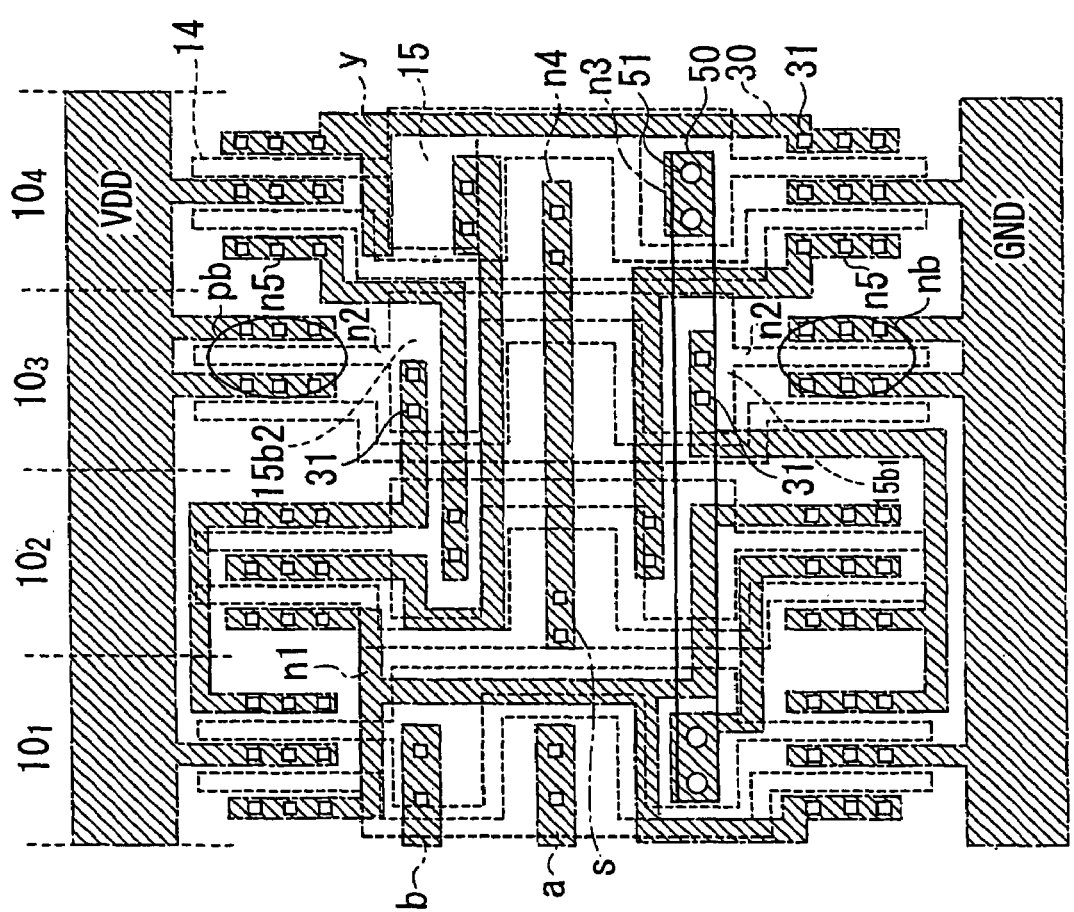
FIG. 4A is a block diagram showing a gate array of a second embodiment of the invention.

FIGS. 4A and 4B are block diagrams of a second embodiment of a gate array according to the invention, FIG. 4A is a plan view and FIG. 4B is a diagram of the equivalent circuit. In these diagrams, for common elements with those in FIGS. 1A, 1B, the same annotations are given This gate array is the same configuration as in FIGS. 1A and 1B, excepting in that in this gate array the source and drain of PMOSpb connected to node n2 are connected to VDD and the source and drain of NMOSpb connected to node n2 are connected to GND.

The source and drain of PMOSpb use the first metal wiring layer 30, and can be connected to the source potential VDD without affecting other wiring. Further, the source and drain of NMOSpb use the first metal wiring layer 30, and can be connected to the ground potential GND without affecting other wiring. The configuration of the second metal wiring layer 50 is the same as shown in FIG. 1A.

In this gate array, the gate wiring is used as the vertical direction wiring of node n2, and the source and drains of respectively the PMOSpb and NMOSnb that are connected to the gate wiring are connected to respectively the source potential VDD and the ground potential GND. It follows that between node n2 and each of the source potential VDD and the ground potential GND there is a reverse direction diode connection state, and a certain capacitance is applied to node n2. However, the increase in wiring capacity caused thereby is of a level that can be ignored, and it has been confirmed in simulations that there are no problems in practice.

As described above, in the array of the second embodiment, the gate wiring of unused transistor (PMOSpb and NMOSnb) is used for the circuit wiring, and so has the same advantages as for the first embodiment. Further, the source and drains of this transistor are fixed to the source potential VDD or the ground potential GND. By doing this, the wiring capacity can be maintained at a certain level, and changes in wiring capacity do not occur and there is the advantage that operation with improved stability becomes possible.

The invention is not limited to the above embodiments, and various variations are possible. As such modifications there are, for example, the following.

(1) An example has been given of a 2 input selector circuit, however, for any CMOS logic circuit, it is possible to be applied in the same way to a gate array of any circuit configuration.

Figure 2C:
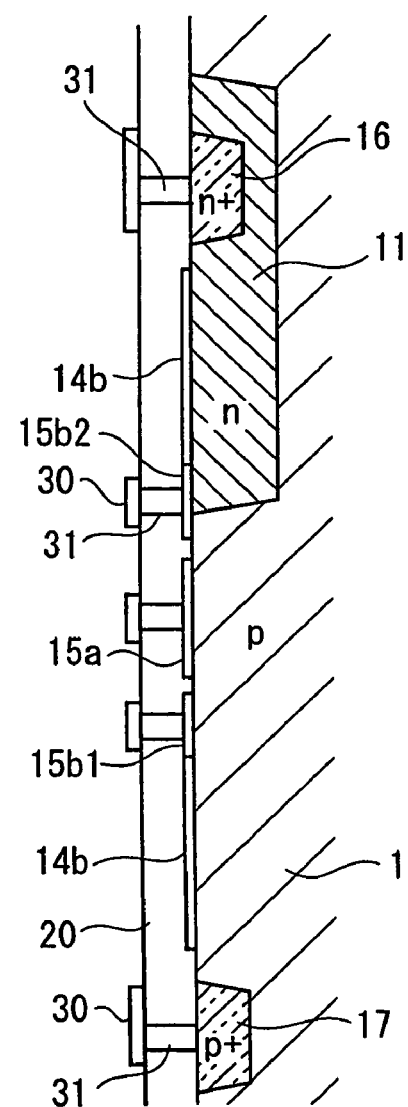
FIG. 2C is a block diagram showing an example of a unit cell using a gate array.
Figure 2B:
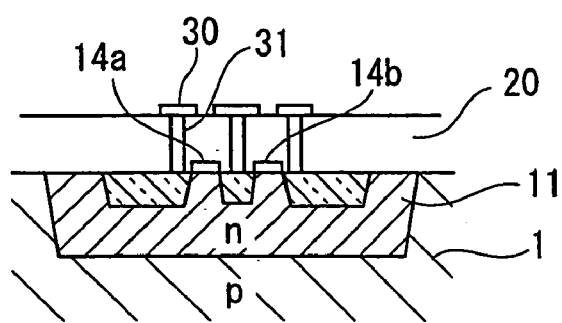
FIG. 2B is a block diagram showing an example of a unit cell using a gate array.

(2) The constitution of unit cells 10 are not restricted to those illustrated in FIGS. 2A to 2C, but a configuration of the source potential VDD region, PMOS, NMOS and the ground potential GND region arranged in a line, with gate wiring provided between the PMOS and NMOS is also possible.

(3) In the second embodiment, the drain and source of an unused transistor are fixed to the source potential VDD or a ground potential GND, however, it is possible to connect the source and drain to respective gates.

What is claimed is:

1. A gate array comprising:
a plurality of unit cells, the unit cells arranged in parallel on a semiconductor substrate and each having a same pattern including a first MOS transistor and a second MOS transistor, the first MOS transistor and the second MOS transistor each including a gate, a source and a drain, the gate of the first MOS transistor and the gate of the second MOS transistor being connected together by gate wiring, with the gate wiring having a first gate terminal portion and a second gate terminal portion;
a plurality of metal wiring lines on the unit cells, with an insulating layer there between; and
a plurality of contacts, that make electrical connections between the metal wiring lines and the first gate terminal portions, the second gate terminal portions, and some of the sources and the drains,
wherein in at least one of the unit cells, the drains and the sources of the first and second MOS transistors are in an unconnected floating state, and the gate wiring of the at least one of the unit cells provides electrical connection between other ones of the plurality of unit cells via the contacts.

2. The gate array of claim 1, wherein the first MOS transistor is a P channel MOS transistor, and the second MOS transistor is an N channel MOS transistor.

* * * * *